US006538481B1

(12) United States Patent
Suetsugu

(10) Patent No.: US 6,538,481 B1
(45) Date of Patent: Mar. 25, 2003

(54) DRIVING CONTROL DEVICE, POWER CONVERTING DEVICE, METHOD OF CONTROLLING POWER CONVERTING DEVICE AND METHOD OF USING POWER CONVERTING DEVICE

(75) Inventor: Eiji Suetsugu, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/173,673

(22) Filed: Jun. 19, 2002

(30) Foreign Application Priority Data

Sep. 5, 2001 (JP) .................................... 2001-268613

(51) Int. Cl.$^7$ ................................................ H03K 3/00
(52) U.S. Cl. .................. 327/109; 327/112; 327/427; 327/389
(58) Field of Search ................. 327/108, 109, 327/111, 112, 427, 434, 435, 437, 379–391, 310, 313; 326/26, 27, 80, 81, 82, 83, 86

(56) References Cited

U.S. PATENT DOCUMENTS

| 4,739,198 A | * | 4/1988 | Maruyama | ................ 327/108 |
| 4,942,309 A | * | 7/1990 | Chieli | ................ 327/109 |
| 5,134,322 A | * | 7/1992 | Bourgeois et al. | .......... 327/381 |
| 5,552,731 A | * | 9/1996 | Diazzi et al. | ................ 327/109 |
| 5,917,359 A | * | 6/1999 | Fukunaga et al. | .......... 327/381 |
| 6,362,679 B2 | * | 3/2002 | Wile | ................ 327/382 |

* cited by examiner

Primary Examiner—Toan Tran
(74) Attorney, Agent, or Firm—Oblon, Spivak, McClelland, Maier & Neustadt, P.C.

(57) ABSTRACT

It is an object to suppress the influence of a noise pulse with a switching operation of a power switching element. A pulse generator (1) alternately outputs a pulse train having two pulses to outputs (A) and (B) synchronously with a signal input to a terminal (HIN). The pulse train is level shifted through switching elements (2) and (3) and resistive elements (8) and (9) which constitute a set of level shift circuits and is input to a flip-flop circuit (4). An output signal of the flip-flop circuit (4) is input to a control electrode of a power switching element (21) through a buffer circuit (35).

8 Claims, 6 Drawing Sheets

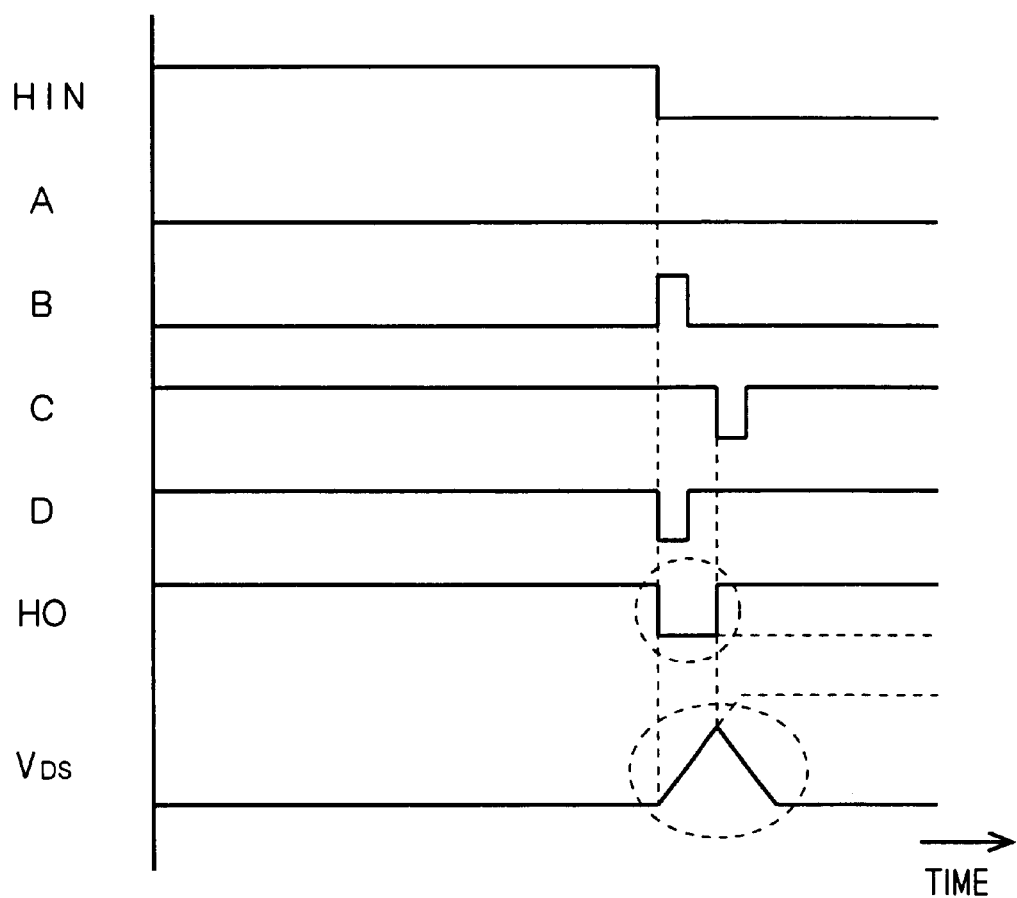

DRIVING CONTROL DEVICE, POWER CONVERTING DEVICE, METHOD OF CONTROLLING POWER CONVERTING DEVICE AND METHOD OF USING POWER CONVERTING DEVICE

BACKGROUND OF THE INVENTION

1. Field of the Invention

The present invention relates to a driving control device, a power converting device, a method of controlling the power converting device and a method of using the power converting device which are suitable for use as an inverter, and more particularly to an improvement in suppression of the influence of a noise pulse with a switching operation of a power switching element.

2. Description of the Background Art

FIG. 5 is a circuit diagram showing a structure of a conventional driving control device to be the background of the present invention. A driving control device 151 is constituted by a high breakdown voltage integrating circuit and comprises a pulse generator 51, switching elements 52 and 53, resistive elements 58 and 59, a flip-flop circuit 54, switching elements 55 and 56, and an inverter element 57. The pulse generator 51 alternately sends a pulse to two outputs A and B synchronously with an input signal sent to a terminal HIN.

A series circuit of the switching element 52 and the resistive element 58 constitutes a level shift circuit. Similarly, a series circuit of the switching element 53 and the resistive element 59 constitutes another level shift circuit. The level shift circuits invert, level-shift and transmit the pulse output from the pulse generator 51 to the flip-flop circuit 54. The flip-flop circuit 54 is an RS flip-flop circuit, is set by a pulse sent to an input C and is reset by a pulse sent to an input D. The switching elements 55 and 56 and the inverter element 57 constitute a buffer circuit for amplifying an output signal of the flip-flop circuit 54 and outputting the amplified signal to a terminal HO.

When using the driving control device 151, a control electrode of a power switching element 71 is connected through the terminal HO to a connecting portion of the switching elements 55 and 56 which are connected in series. Impedances 73 and 74 may be connected to the control electrodes of the power switching element 71 and a power switching element 72. The power switching elements 71 and 72 are connected to each other in series. A load 81 is connected through a terminal OUT to a connecting portion of the power switching elements 71 and 72. An inductive load such as a motor is usually used for the load 81.

A power voltage of the pulse generator 51 is supplied from an external d.c. power supply connected to a terminal GND and a terminal Vcc. Power voltages of the flip-flop circuit 54, the switching elements 55 and 56 and the inverter element 57 are supplied through terminals VS and VB. The terminal VS is connected to the terminal OUT. A set of level shift circuits having the switching elements 52 and 53 and the resistive elements 58 and 59 are connected to the terminals GND and VB. Consequently, these level shift circuits convert a level of a signal having an electric potential of the terminal GND as a reference potential into a level of a signal having an electric potential of the terminal VS as the reference potential.

FIG. 6 is a timing chart showing a signal of each portion in an operation of the driving control device 151. In the following drawings, the designation of each portion in the device is exactly used as that of the signal in each portion. For example, the same designation "HIN" is added to a signal input to the terminal HIN.

When the signal input to the terminal HIN rises to have a high level, a pulse having the high level is sent from the output A of the pulse generator 51 so that a pulse having a low level is sent to the input C of the flip-flop circuit 54. As a result, the flip-flop circuit 54 is set so that a signal of the terminal HO rises to have the high level. Consequently, the power switching element 71 is turned on. Correspondingly, a current I flowing in the power switching element 71 is started to be increased and a voltage $V_{DS}$ between a pair of main electrodes of the power switching element 71 is started to be dropped.

When the signal input to the terminal HIN falls to have the low level, the pulse having the high level is sent from the output B of the pulse generator 51 so that the pulse having the low level is sent to the input D of the flip-flop circuit 54. As a result, the flip-flop circuit 54 is reset so that the signal of the terminal HO falls to have the low level. Consequently, the power switching element 71 is turned off. Correspondingly, the current I is started to be decreased and the voltage $V_{DS}$ is started to be raised. Thus, the power switching element 71 is turned on and off synchronously with the signal input through the terminal HIN.

In the conventional driving control circuit 151, however, there has been a problem in that a noise pulse is induced to the input of the flip-flop circuit 54 with the switching operation of the power switching element 71 and the switching operation of the power switching element 71 is thereby influenced in some cases. FIG. 7 is a timing chart showing the signal of each portion in the device which is obtained when the power switching element 71 is turned on, illustrating the influence of the noise pulse.

When a pulse is sent to the output A, the power switching element 71 is turned on so that the voltage $V_{DS}$ is dropped. The drop in the voltage $V_{DS}$ implies a rise in the electric potential of the terminal VS. If a voltage of a power supply to be connected to the power switching elements 71 and 72 is 300 V, the electric potential of the terminal VS is raised from 0 toward 300 V. If a change rate dV/dt of the voltage $V_{DS}$ is great, a current flows through the terminal VS by the action of a floating capacitance present in the driving control device 151. As a result, the current flows through a parasitic capacitance of the switching element 53 so that a noise pulse having a low level is applied to the input D of the flip-flop circuit 54 in some cases.

When the noise pulse is applied to the input D, the flip-flop circuit 54 is reset. As a result, the signal of the terminal HO is returned to the low level so that the power switching element 71 is turned off. Consequently, the current I is started to be decreased so that the voltage $V_{DS}$ is started to be raised. More specifically, a normal turn-on operation of the power switching element 71 is blocked.

FIG. 8 is a timing chart showing a signal of each portion in the device which is obtained when the power switching element 71 is turned off, illustrating the influence of the noise pulse. When a pulse is sent to the output B, the power switching element 71 is turned off so that the voltage $V_{DS}$ is raised. The rise in the voltage $V_{DS}$ implies the drop in the electric potential of the terminal VS. If the voltage of the power supply to be connected to the power switching elements 71 and 72 is 300 V, the electric potential of the terminal VS is dropped from 300 V toward 0. If a change rate dV/dt of the voltage $V_{DS}$ is great, a current flows through the terminal VS by the action of a floating capacitance present in the driving control device 151. As a result, the current flows through a parasitic capacitance of the switching element 52 so that a noise pulse having a low level is applied to the input C of the flip-flop circuit 54 in some cases.

When the noise pulse is applied to the input C, the flip-flop circuit 54 is set. As a result, the signal of the terminal HO is returned to the high level so that the power switching element 71 is turned on. Consequently, the current I is started to be increased so that the voltage $V_{DS}$ is started to be dropped. More specifically, a normal turn-off operation of the power switching element 71 is blocked. In the conventional driving control device 151, thus, there has been a problem in that the influence of the noise pulse is caused with the switching operation of the power switching element 71 in some cases.

SUMMARY OF THE INVENTION

In order to eliminate the drawbacks of the conventional art, it is an object of the present invention to provide a driving control device, a power converting device, a method of controlling the power converting device and a method of using the power converting device which can suppress the influence of a noise pulse with the switching operation of a power switching element.

The present invention is directed to a driving control device for controlling a driving operation of a power switching element, including a pulse generator for alternately outputting a pulse to two outputs synchronously with a signal input from an outside and for outputting a pulse train including two pulses having mutual time intervals preset as the pulse to at least one of the two outputs, a set of level shift circuits for level shifting output signals of the two outputs of the pulse generator respectively, and a flip-flop circuit to be set in response to one of output signals of the set of level shift circuits and to be reset in response to the other output signal.

The input signal is level shifted after a conversion into the form of a pulse and is restored to have an original waveform through the flip-flop circuit. Therefore, it is possible to achieve the level shift of the input signal while decreasing a power loss in the level shift circuit. In addition, the input pulse sent to at least one of the set of level shift circuits is the pulse train having two pulses. Therefore, it is possible to suppress the influence of the noise pulse on the turn-on operation or turn-off operation of the power switching element.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 6 to 8 are timing charts showing an operation of the driving control device in FIG. 5.

DESCRIPTION OF THE PREFERRED EMBODIMENTS (Structure of Device)

Figure 1:
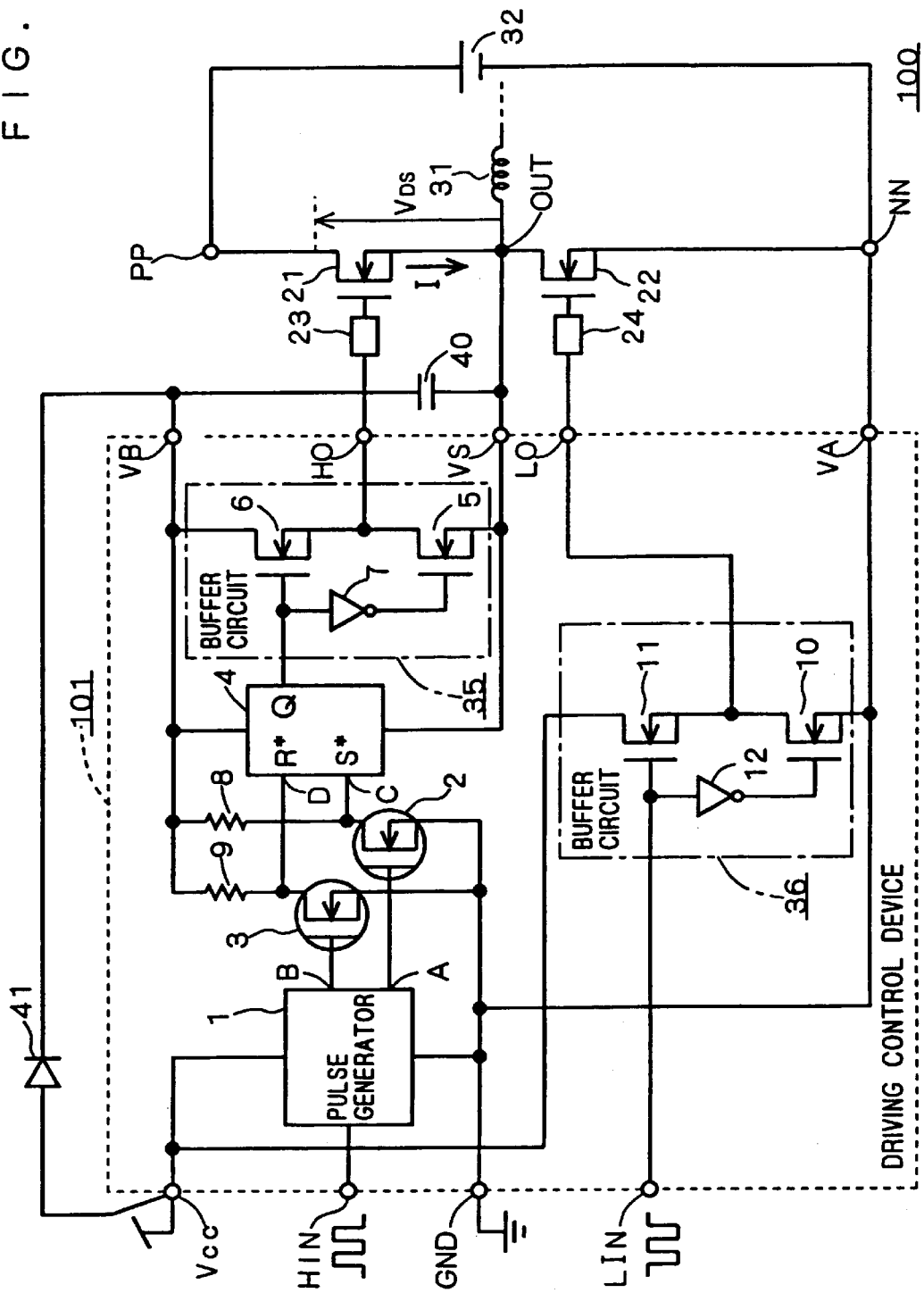
FIG. 1 is a circuit diagram showing a driving control device according to an embodiment of the present invention.

FIG. 1 is a circuit diagram showing a structure of a driving control device according to an embodiment of the present invention. A driving control device 101 comprises a pulse generator 1, switching elements 2 and 3, resistive elements 8 and 9, a flip-flop circuit 4, switching elements 5 and 6, an inverter element 7, switching elements 10 and 11, and an inverter element 12. Each element constituting the driving control device 101 is preferably integrated into a single semiconductor chip. More specifically, the driving control device 101 is preferably constituted as a high breakdown voltage integrating circuit to be a single chip.

Each of the switching elements 2 and 3 is a high breakdown voltage switching element and an n-channel type high breakdown voltage MOSFET (an MOS type field effect transistor) is used in an example of FIG. 1. A series circuit of the switching element 2 and the resistive element 8 constitutes a level shift circuit. Similarly, a series circuit of the switching element 3 and the resistive element 9 constitutes another level shift circuit. These level shift circuits invert, level-shift and transmit a pulse output from the pulse generator 1 to the flip-flop circuit 4. The flip-flop circuit 4 is an RS flip-flop circuit, is set by a pulse sent to an input C and is reset by a pulse sent to an input D. FIG. 1 shows the example in which a set signal S and a reset signal R are low active (S*, R*).

Each of the switching elements 5 and 6 is an n-channel type MOSFET in the example of FIG. 1. The switching elements 5 and 6 and the inverter element 7 constitute a buffer circuit 35 for amplifying an output signal of the flip-flop circuit 4 and outputting the amplified signal to a terminal HO. Similarly, each of the switching elements 10 and 11 is an n-channel type MOSFET in the example of FIG. 1. The switching elements 10 and 11 and the inverter element 12 constitute a buffer circuit 36 for amplifying a signal input through a terminal LIN and outputting the amplified signal to a terminal LO.

When using the driving device 101, a control electrode of a power switching element 21 is connected through the terminal HO to a connecting portion of the switching elements 5 and 6 which are connected in series. Similarly, a control electrode of a power switching element 22 is connected through the terminal LO to a connecting portion of the switching elements 10 and 11 which are connected in series. In the example of FIG. 1, both of the power switching elements 21 and 22 are n-channel type MOSFETs and the control electrode is a gate electrode. As is illustrated in FIG. 1, impedances 23 and 24 may be provided between the terminals HO and LO and the control electrodes of the power switching elements 21 and 22, respectively.

The power switching elements 21 and 22 are connected to each other in series. A power supply 32 is connected through terminals PP and NN to one of main electrodes (a drain electrode in FIG. 1) of the power switching element 21 and one of main electrodes (a source electrode in FIG. 1) of the power switching element 22. A load 31 is connected through a terminal OUT to a connecting portion of the power switching elements 21 and 22. An inductive load such as a motor is usually used for the load 31.

The driving control device 101 and the power switching elements 21 and 22 constitute a power converting device 100. The power converting device 100 corresponds to a component unit for a single phase part of a three-phase inverter. A circuit element for transmitting a signal from a terminal HIN to the terminal HO in the driving control device 101 and the power switching element 21 belong to an upper arm, and a circuit element for transmitting a signal from the terminal LIN to the terminal LO in the driving control device 101 and the power switching element 22 belong to a lower arm. Power of the switching elements 10 and 11 and the inverter element 12 which belong to the lower arm and a supply voltage of the pulse generator 1 belonging to the upper arm are supplied through an external d.c. power supply connected to a terminal GND and a terminal Vcc. The terminal GND is connected to the terminal NN through a terminal VA.

Power voltages of the flip-flop circuit 4, the switching elements 5 and 6 and the inverter element 7 which belong to the upper arm are supplied through terminals VS and VB. The terminal VS is connected to the terminal OUT. In the example of FIG. 1, a capacitive element 40 is connected to the terminals VS and VB and a diode 41 is connected to the terminals Vcc and VB such that a current is supplied from the terminal Vcc to the terminal VB. With the ON/OFF operation of the power switching element 22, a current is intermittently supplied to the capacitive element 40 through the diode 41. Consequently, a voltage having an almost equal magnitude to a voltage supplied between the terminal GND and the terminal Vcc is continuously held in the capacitive element 40.

A set of level shift circuits having the switching elements 2 and 3 and the resistive elements 8 and 9 are connected to the terminals GND and VB. Consequently, these level shift circuits convert a level of a signal having an electric potential of the terminal GND as a reference potential into a level of a signal having an electric potential of the terminal VS as the reference potential.

Figure 2:
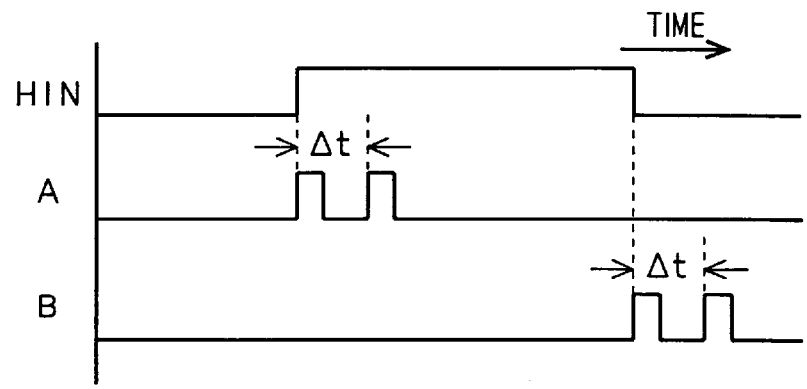
FIG. 2 is a timing chart showing an operation of a pulse generator in FIG. 1, FIGS. 3 and 4 are timing charts showing an operation of the driving control device in FIG. 1.

As shown in a timing chart of FIG. 2, the pulse generator 1 alternately outputs a pulse train having two pulses to two outputs A and B synchronously with a signal input to the terminal HIN. A time interval Δt between the two pulses has a preset constant value. More specifically, the pulse generator 1 is a two-shot pulse generator which can easily be constituted by a conventional known circuit technique. As a matter of course, the pulse generator 1 may be constituted by only hardware or may be constituted by a CPU and a memory having a program to define an operation of the CPU. The time interval Δt between the two pulses may be set to have a value varied between the outputs A and B.

(Addition)

In each of the drawings subsequent to FIG. 2, the designation of each portion in the device is exactly used as that of the signal in each portion. For example, the same designation "HIN" is added to a signal input to the terminal HIN.

(Operation of Device)

Figure 3:
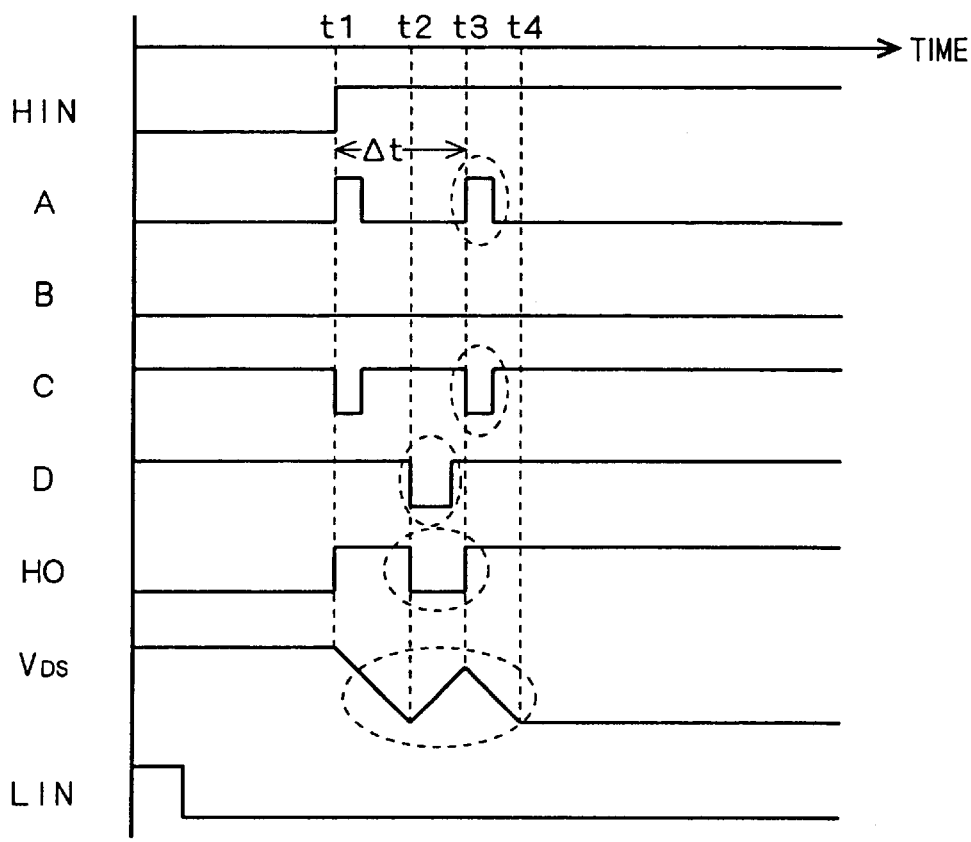

FIG. 3 is a timing chart showing a state of a change of a signal in each portion which is obtained when the power switching element 21 is to be turned on. In order to turn on the power switching element 21, a signal input to the terminal HIN rises to have a high level at a time t1. Consequently, a first pulse having the high level is sent from the output A of the pulse generator 1 and a pulse having a low level is sent to the input C of the flip-flop circuit 4. As a result, the flip-flop circuit 4 is set so that a signal of the terminal HO rises to have the high level. Thus, the power switching element 21 is turned on. Consequently, a current I flowing in the power switching element 21 is started to be increased and a voltage $V_{DS}$ between a pair of main electrodes of the power switching element 21 is started to be dropped.

The drop in the voltage $V_{DS}$ implies a rise in an electric potential of the terminal VS. If a voltage of the power supply 32 is 300 V, the electric potential of the terminal VS is raised from 0 toward 300 V. In this process, a noise pulse having the low level is applied to the input D of the flip-flop circuit 4 in some cases. A time taken from the time t1 to a time t2 that the noise pulse is generated depends on the power supply 32 and the load 31 in addition to a structure of the driving control device 101. When the noise pulse is applied to the input D, the flip-flop circuit 4 is reset. As a result, the signal of the terminal HO is returned to the low level so that the power switching element 21 is turned off. Consequently, the current I is started to be decreased and the voltage $V_{DS}$ is started to be raised.

By the action of the pulse generator 1, however, a second pulse having a high level is sent to the output A at a time t3 delayed from the time t1 by the time interval Δt. As a result, the flip-flop circuit 4 is set again and the power switching element 21 is turned on again. At a subsequent time t4, the transition of the voltage $V_{DS}$ is completed. Thus, the pulse generator 1 generates a pulse train having two pulses. Therefore, even if the flip-flop circuit 4 is influenced by the noise pulse, the power switching element 21 can be normally turned on.

A change rate dV/dt of an electric potential of the terminal VS contributes to the generation of the noise pulse. The change rate dV/dt is proportional to both the current I and the voltage $V_{DS}$. For this reason, if the current I is smaller and the voltage $V_{DS}$ is lower, the noise pulse is generated with more difficulty. As shown in FIG. 3, accordingly, it is desirable that the time interval Δt should be set such that the second pulse is sent to the input C before the voltage $V_{DS}$ is returned to have a value obtained immediately before the time t1 by the influence of the noise pulse. At the time t3 that the second pulse is input, consequently, the voltage $V_{DS}$ is lower than that at the time t1. Therefore, the noise pulse is generated with difficulty after the time t3. More specifically, it is possible to more effectively prevent the noise pulse from being generated again to reset the flip-flop circuit 4 after the second pulse is input.

Accordingly, it is desirable that the driving control device 101 having the time interval Δt set properly should be selected depending on the power supply 32 and the load 31, that is, the purpose of use. This also implies that the power supply 32 and the load 31 are connected to satisfy the preferred conditions when the driving control device 101 having the time interval Δt set is to be used.

In FIG. 3, a signal input to the terminal LIN is started to have the low level before a signal input to the terminal HIN is converted to have the high level at the time t1. This is performed in order to prevent a short circuit current from flowing by simultaneously turning on the power switching elements 21 and 22 which are connected in series.

Figure 4:
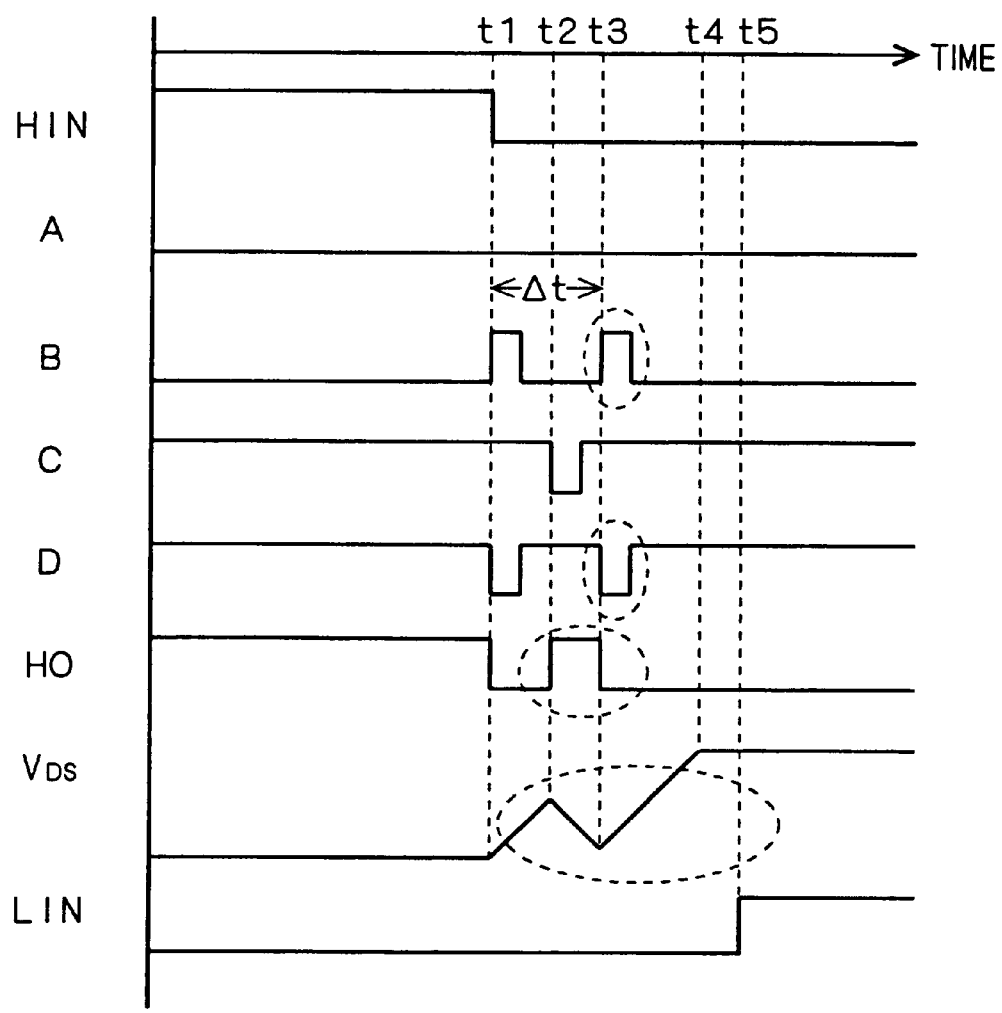
Figure 5:
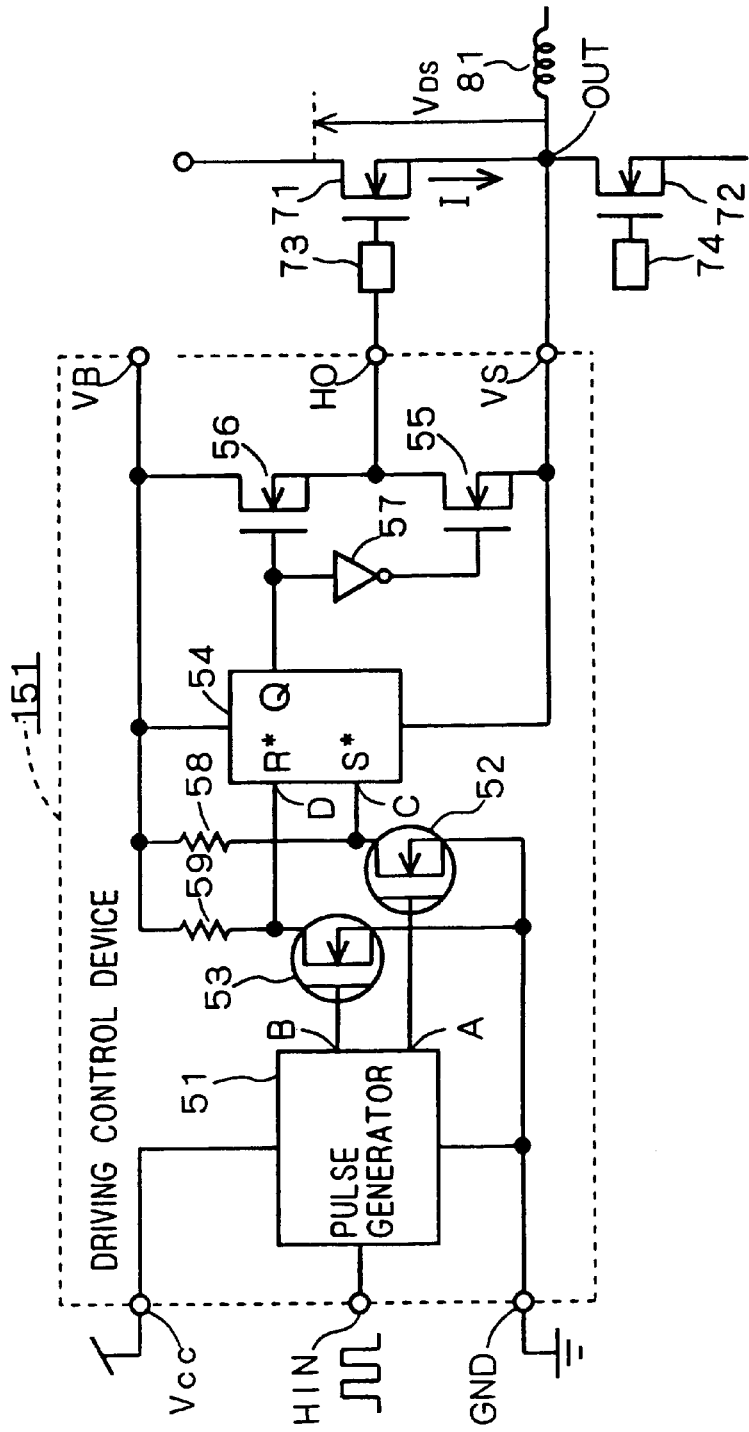
FIG. 5 is a circuit diagram showing a driving control device according to a conventional art.
Figure 6:
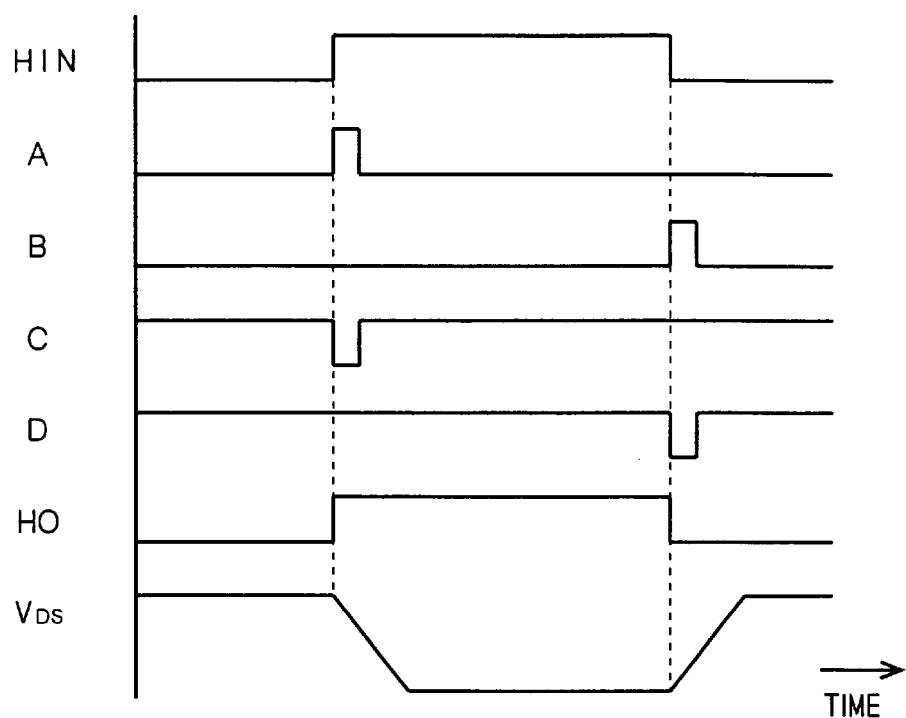
Figure 7:
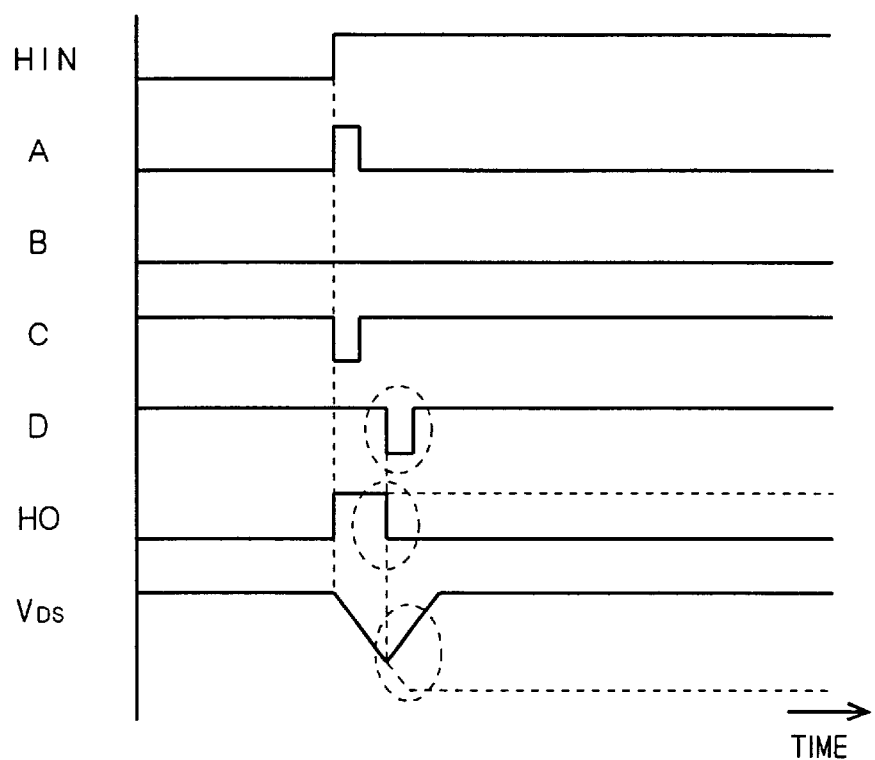

FIG. 4 is a timing chart showing a state of a change of a signal in each portion which is obtained when the power switching element 21 is to be turned off. In order to turn off the power switching element 21, a signal input to the terminal HIN falls to have a low level at a time t1. Consequently, a first pulse having a high level is sent from the output B of the pulse generator 1 and a pulse having a low level is sent to the input D of the flip-flop circuit 4. As a result, the flip-flop circuit 4 is reset so that a signal of the terminal HO falls to have the low level. Thus, the power switching element 21 is turned off. Consequently, the current I is started to be decreased and the voltage $V_{DS}$ is started to be raised.

The rise in the voltage $V_{DS}$ implies a drop in an electric potential of the terminal VS. In this process, a noise pulse having the low level is applied to the input C of the flip-flop circuit 4 in some cases. A time taken from the time t1 to a time t2 that the noise pulse is generated depends on the power supply 32 and the load 31 in addition to the structure of the driving control device 101. When the noise pulse is applied to the input C, the flip-flop circuit 4 is set. As a result, the signal of the terminal HO is returned to the high level so that the power switching element 21 is turned on. Consequently, the current I is started to be increased and the voltage $V_{DS}$ is started to be dropped.

By the action of the pulse generator 1, however, a second pulse having a high level is sent to the output B at a time t3 delayed from the time t1 by the time interval Δt. As a result, the flip-flop circuit 4 is reset again and the power switching element 21 is turned off again. At a subsequent time t4, the transition of the voltage $V_{DS}$ is completed. Thus, the pulse generator 1 generates a pulse train having two pulses. Therefore, even if the flip-flop circuit 4 is influenced by the noise pulse, the power switching element 21 can be normally turned off.

As shown in FIG. 4, it is desirable that the time interval Δt should be set such that the second pulse is sent to the input D before the voltage $V_{DS}$ is returned to have a value obtained immediately before the time t1 by the influence of the noise pulse. At the time t3 that the second pulse is input, consequently, the current I is smaller than that at the time t1. Therefore, the noise pulse is generated with difficulty after the time t3. More specifically, it is possible to more effectively prevent the noise pulse from being generated again to set the flip-flop circuit 4 after the second pulse is input.

Accordingly, it is desirable that the driving control device 101 having the time interval Δt set properly should be selected depending on the power supply 32 and the load 31, that is, the purpose of use. This also implies that the power supply 32 and the load 31 are connected to satisfy the preferred conditions when the driving control device 101 having the time interval Δt set is to be used.

As shown in FIG. 4, the signal input to the terminal LIN preferably carries out a transition to have the high level after the time t3 that the second pulse is output from the pulse generator 1, and more preferably, after the time t4 that the transition of the voltage $V_{DS}$ is completed (time t5). Consequently, it is possible to prevent a short circuit current from flowing by simultaneously turning on the power switching elements 21 and 22 which are connected in series.

(Procedure for Use of Device)

In order to use the driving control device 101, it is preferable that the power switching elements 21 and 22 should be connected to constitute the power converting device 100, and furthermore, the power supply 32, the load 31, the capacitive element 40 and the diode 41 should be connected and the d.c. power supply should be connected to the terminals Vcc and GND as shown in FIG. 1. In the case in which the power converting device 100 is to be acquired, it is not necessary to separately prepare the switching elements 21 and 22.

(Variant)

(1) While the pulse generator 1 outputs the pulse train having two pulses to both of the two outputs in the driving control device 101, it is also possible to embody such a configuration that the pulse train having two pulses is sent to one of the two outputs and only one pulse is sent to the other output. In this case, it is possible to suppress the influence of a noise pulse for one of the turn-on operation and the turn-off operation in the power switching element 21. In the case in which the noise pulse appears in only one of the operations, a device having such a configuration is enough.

(2) While the driving control device 101 comprises both the circuit belonging to the upper arm and the circuit belonging to the lower arm, it is also possible to embody a driving control device having only the circuit belonging to the upper arm. In this case, it is preferable that the circuit belonging to the lower arm should be prepared separately in order to control the driving operation of the power switching elements 21 and 22.

While the invention has been shown and described in detail, the foregoing description is in all aspects illustrative and not restrictive. It is therefore understood that numerous modifications and variations can be devised without departing from the scope of the invention.

What is claimed is:

1. A driving control device for controlling a driving operation of a power switching element, comprising:
   a pulse generator for alternately outputting a pulse to two outputs synchronously with a signal input from an outside and for outputting a pulse train including two pulses having mutual time intervals preset as said pulse to at least one of said two outputs;
   a set of level shift circuits for level shifting output signals of said two outputs of said pulse generator respectively; and
   a flip-flop circuit to be set in response to one of output signals of said set of level shift circuits and to be reset in response to the other output signal.

2. The driving control device according to claim 1, wherein said pulse generator outputs a pulse train including two pulses having mutual time intervals preset as said pulse to both of said two outputs.

3. The driving control device according to claim 1, wherein each of said level shift circuits includes a resistive element and a switching element which are connected to each other in series.

4. The driving control device according to claim 1, further comprising a buffer circuit for amplifying an output signal of said flip-flop circuit.

5. The driving control device according to claim 4, wherein said buffer circuit is a first buffer circuit and said input signal is a first input signal, further comprising a second buffer circuit for amplifying a second input signal from an outside.

6. A power converting device comprising:
   the driving control device according to claim 5;
   a first power switching element connected to said first buffer circuit to be driven by said first buffer circuit; and
   a second power switching element connected to said second buffer circuit and connected to said first power switching element in series to be driven by said second buffer circuit.

7. A method of controlling a power converting device for inputting said first and second input signals to said power converting device according to claim 6, thereby carrying out ON/OFF control of said first and second power switching elements,
   wherein after said pulse train is output to one of said two outputs to turn off said first power switching element, said first and second input signals are input to turn on said second power switching element.

8. A method of using the power converting device according to claim 6, comprising the steps of:
   (a) connecting a power supply and a load to said first and second power switching elements; and
   (b) inputting said first and second input signals to said power converting device, thereby carrying out ON/OFF control of said first and second power switching elements, said step (a) including the step of:
(a-1) connecting said power supply and said load in such a manner that a second pulse of said two pulses is input before a voltage between a pair of main electrodes of said first power switching element is returned to have a value obtained immediately before said first pulse is input due to a first pulse of said two pulses is sent to one of inputs of said flip-flop circuit and a noise pulse is then sent to the other input.

* * * * *